United States Patent [19]
Roohparvar

[11] Patent Number: 5,793,775
[45] Date of Patent: Aug. 11, 1998

[54] LOW VOLTAGE TEST MODE OPERATION ENABLE SCHEME WITH HARDWARE SAFEGUARD

[75] Inventor: Frankie F. Roohparvar, Cupertino, Calif.

[73] Assignee: Micron Quantum Devices, Inc., Santa Clara, Calif.

[21] Appl. No.: 592,228

[22] Filed: Jan. 26, 1996

[51] Int. Cl.⁶ .................................. G01R 31/28
[52] U.S. Cl. ............... 371/22.1; 371/22.3; 371/22.5; 371/22.4
[58] Field of Search .................. 365/200, 201; 371/22.1, 22.2, 22.3, 22.4, 22.5

[56] References Cited

U.S. PATENT DOCUMENTS

| | | | |
|---|---|---|---|
| 4,309,627 | 1/1982 | Tabata | 307/362 |
| 4,321,489 | 3/1982 | Higuchi et al. | 307/362 |
| 4,437,025 | 3/1984 | Liu et al. | 307/475 |
| 4,571,704 | 2/1986 | Bohac, Jr. | 365/156 |
| 4,658,156 | 4/1987 | Hashimoto | 307/350 |
| 4,858,185 | 8/1989 | Kowshik et al. | 365/181 |
| 4,922,133 | 5/1990 | Iwahashi et al. | 307/363 |
| 5,031,142 | 7/1991 | Castro | 365/49 |
| 5,047,664 | 9/1991 | Moyal | 307/303 |
| 5,077,738 | 12/1991 | Larsen et al. | 371/15.1 |
| 5,083,045 | 1/1992 | Yim et al. | 307/350 |
| 5,097,146 | 3/1992 | Kowalski et al. | 307/350 |
| 5,118,968 | 6/1992 | Douglas et al. | 307/362 |
| 5,134,586 | 7/1992 | Steele | 365/201 |
| 5,144,159 | 9/1992 | Frisch et al. | 307/272 |
| 5,177,745 | 1/1993 | Rozman | 371/21.1 |
| 5,214,316 | 5/1993 | Nagai | 307/272 |
| 5,262,990 | 11/1993 | Mills et al. | 365/189 |
| 5,278,458 | 1/1994 | Holland et al. | 307/272 |
| 5,280,198 | 1/1994 | Almulla | 307/296 |
| 5,293,610 | 3/1994 | Schwarz | 395/425 |
| 5,311,470 | 5/1994 | Atsumi et al. | 365/189 |
| 5,317,532 | 5/1994 | Ochii | 365/149 |
| 5,378,936 | 1/1995 | Kokubo et al. | 327/77 |
| 5,408,435 | 4/1995 | McClure et al. | 365/201 |
| 5,469,100 | 11/1995 | Wuidart et al. | 327/262 |
| 5,526,364 | 6/1996 | Roohparvar | 371/22.1 |
| 5,615,159 | 3/1997 | Roohparvar | 365/201 |
| 5,636,166 | 6/1997 | Roohparvar | 365/194 |

FOREIGN PATENT DOCUMENTS

| | | | |
|---|---|---|---|
| 3-206709 | 9/1991 | Japan | H03K 17/22 |
| 5-122052 | 5/1993 | Japan | H03K 19/0185 |

OTHER PUBLICATIONS

U.S. application No. 08/493,162, Roohparvar, filed Mar. 3, 1998, Class 327, Subclass 81.

Primary Examiner—Viet Q. Nguyen
Attorney, Agent, or Firm—Schwegman, Lundberg, Woessner & Kluth, P.A.

[57] ABSTRACT

A test mode circuit for use in a data system includes a test mode code latch for receiving a test mode code. A switch, which when turned on, couples the test mode code latch to the input so that the test mode code can be transferred from the input to the test mode code latch. A test mode command decoder is coupled to the test mode code latch for decoding the test mode code to initiate a test mode of operation in the data system. A data storage unit is coupled to the test mode command decoder for storing a data bit which corresponds to a low voltage test mode enable signal. The data bit may be modified during the test mode of operation. A low voltage test mode circuit is coupled to the data storage unit which, after first being enabled by the low voltage test mode enable signal, can be controlled to turn the switch on and off. An enable signal generation circuit couples the low voltage test mode circuit to the switch for turning the switch on and off. A method of loading a test mode code into a data system is also disclosed.

34 Claims, 8 Drawing Sheets

LOW VOLTAGE TEST MODE OPERATION ENABLE SCHEME WITH HARDWARE SAFEGUARD

BACKGROUND OF THE INVENTION

1. Field of the Invention

The present invention relates generally to semiconductor circuits and packaged integrated circuits, such as memory chips, data registers and the like. More particularly, the present invention relates to circuitry used for enabling test mode operations in such parts.

2. Description of the Related Art

Testing and potentially modifying internal parameters of memory chips for the purpose of circuit optimization is critically important. This is particularly important because memory chips are becoming more complex and the time to market is a very critical factor in the success of any chip. In some chips, this is done by making modifications to masks such as metal or contact. The masks are processed toward the end of the fabrication process and making changes to the circuitry using these masks does not add too much of a time penalty. Although this is a valid solution, it still fails to allow for maximum flexibility or minimize turnaround times.

With memories such as non-volatile memories, more flexibility is added through the use of such memory elements in modifying circuit parameters. By programming a specific pattern in these memory elements, one can change the configuration of the circuitry and even the configuration of the entire chip. Such modifications are usually done in the factory before the part is shipped to a customer or end user. The accidental modification of any of these settings by an end user can have devastating effects on the operation of the chip and must be avoided. Therefore, the modification of these settings are done through non-user modes of operation referred to herein as test modes.

Test modes are typically used for stressing or changing the internal settings of the parts. The accidental or even intentional use of such modes by an end user could damage the part. Therefore, test modes should have safeguards which minimize the chances of accidental entry of the test modes by end users.

U.S. patent application Ser. No. 08/386,704, filed Feb. 10, 1995, for "APPARATUS FOR ENTERING AND EXECUTING TEST MODE OPERATIONS FOR MEMORY", discloses a scheme to enter and execute different test modes that minimizes the chances of accidental user entry of the test modes. The contents of this application are hereby fully incorporated into the present application by reference.

The test mode enable scheme disclosed in application Ser. No. 08/386,704 provides safeguards to assure that test modes can only be activated when specific conditions are present that are not usually performed by an end user. As a hardware safeguard, some of the voltages applied to the chip must be raised to values higher than the regular voltages applied to the pins of that chip during normal operations. If this were the only safeguard, however, then a noisy set-up may potentially trigger a test mode. Thus, the scheme disclosed in application Ser. No. 08/386,704 utilizes a software safeguard in combination with the hardware safeguard.

Although the test mode enable scheme disclosed in application Ser. No. 08/386,704 provides sufficient protection against accidental user entry of test modes, not all test setups have the ability to provide the high voltages required to place the part in a test mode. One solution is to not use the high voltage safeguard and rely solely on the software safeguard. The disadvantage of this solution is that one does not want to rely solely on software to enter and execute test modes since the end user might enter the test modes accidentally.

Thus, there is a need for a test mode enable scheme which does not require that high voltages be applied to the part in order to enter a test mode, but which still provides maximum hardware and software protection in order to minimize the chances of accidental entry of test modes by an end user. Such a scheme should provide a hardware protection so that test modes cannot be accessed by software alone.

SUMMARY OF THE INVENTION

The present invention provides a data system operable in a normal mode of operation and a test mode of operation. The data system includes a non-volatile data storage unit for storing a data bit, and test mode means, coupled to the non-volatile data storage unit, for receiving test mode codes and for initiating the test mode of operation in the data system in response thereto. The test mode means is disabled by a first state of the data bit.

The present invention also provides a memory system operable in a normal mode of operation and a test mode of operation. Access to the test mode of operation occurs upon detection of test mode access states. The memory system includes a non-volatile data storage unit having a first state. First test mode detection means detects a first test mode access state having a first configuration which is different from states which control the memory system in the normal mode of operation. Second test mode detection means, coupled to the non-volatile data storage unit, detects a second test mode access state having a second configuration which is compatible with states which control the memory system in the normal mode of operation. The second test mode detection means is enabled by the non-volatile data storage unit being in the first state.

The present invention also provides a memory system operable in a normal mode of operation and a test mode of operation. Access to the test mode of operation occurs upon detection of test mode access states. The memory system includes a non-volatile data storage unit having a first state and a second state. First test mode detection means, coupled to the non-volatile data storage unit, detects a first test mode access state having a first configuration which is different from states which control the memory system in the normal mode of operation. The first test mode detection means is enabled by the non-volatile data storage unit being in the first state. Second test mode detection means, coupled to the non-volatile data storage unit, detects a second test mode access state having a second configuration which is compatible with states which control the memory system in the normal mode of operation. The second test mode detection means is enabled by the non-volatile data storage unit being in the second state.

The present invention also provides a test mode circuit for use in a data system having an input. The test mode circuit includes a test mode code latch for receiving a test mode code. A switch is included which when turned on couples the test mode code latch to the input so that the test mode code can be transferred from the input to the test mode code latch. A test mode command decoder is coupled to the test mode code latch for decoding the test mode code to initiate a test mode of operation in the data system. A data storage unit is coupled to the test mode command decoder for storing a data bit which corresponds to a low voltage test mode enable signal. The data bit may be modified during the test mode of operation. A low voltage test mode circuit is coupled to the data storage unit which, after first being enabled by the low voltage test mode enable signal, can be controlled to turn the switch on and off. An enable signal generation circuit couples the low voltage test mode circuit to the switch for turning the switch on and off.

The present invention also provides a memory system which includes a data buffer and a normal mode command decoder coupled to decode normal mode codes received from the data buffer and for generating normal mode command signals in response thereto. A test mode command decoder decodes test mode codes and generates test mode command signals in response thereto to initiate a test mode of operation in the memory system. A switch which when turned on completes a path between the data buffer and the test mode command decoder so that test mode codes can be transferred from the data buffer to the test mode command decoder. A low voltage test mode circuit is coupled to the normal mode command decoder which, after first being enabled during the test mode of operation, can be controlled by the normal mode command signals to turn the switch on and off. An enable signal generation circuit couples the low voltage test mode circuit to the switch for turning the switch on and off.

The present invention also provides a method of loading a test mode code into a data system. The method includes the steps of: setting a bit in a data storage unit to enable a low voltage test mode circuit; decoding a first normal mode code; activating a first output of the low voltage test mode circuit in response to decoding the first normal mode code; decoding a second normal mode code; activating a second output of the low voltage test mode circuit in response to decoding the second normal mode code; activating a test mode load enable signal in response to the first and second outputs of the low voltage test mode circuit being activated; turning on a switch to complete a path between an input and a test mode code latch in response to the first and second outputs of the low voltage test mode circuit being activated; loading a test mode code into the test mode code latch; deactivating the first output of the low voltage test mode circuit; and deactivating the test mode load enable signal.

A better understanding of the features and advantages of the present invention will be obtained by reference to the following detailed description of the invention and accompanying drawings which set forth an illustrative embodiment in which the principles of the invention are utilized.

DETAILED DESCRIPTION OF THE PREFERRED EMBODIMENT

The present invention provides a scheme to enter and execute different test modes in an integrated circuit that minimizes the chances of accidental entry of test modes. Such accidental entry is avoided by providing safeguards to ensure that test modes are only activated when specific conditions are present.

As discussed above, there is a need to be able to execute test modes in an integrated circuit, or other data system, without having to apply high voltages to the part. However, there must still be safeguards provided in the chip against accidental user entry into the test modes. In general, the present invention utilizes a non-volatile data storage unit that can only be set through high voltage test mode operation. The non-volatile data storage unit produces a signal which enables low voltage test mode circuitry which allows the entry into and execution of additional test modes which are initiated by a software sequence without the need for high voltages. After completion of all necessary tests in this "low voltage test mode", the non-volatile data storage unit is then reset before the part is shipped to an end user. Once the non-volatile data storage unit is reset, test modes can only be entered and executed by applying high voltages to the part, i.e., via the "high voltage test mode". This provides a hardware safeguard against accidental user entry into the test modes. This invention keeps the test modes inaccessible to the end user while allowing the flexibility of executing the test modes in a low voltage mode during testing of the parts while in the factory. Furthermore, this invention maintains maximum hardware protection during entry of test mode codes and both maximum software and hardware protection during execution of test modes.

Figure 1:
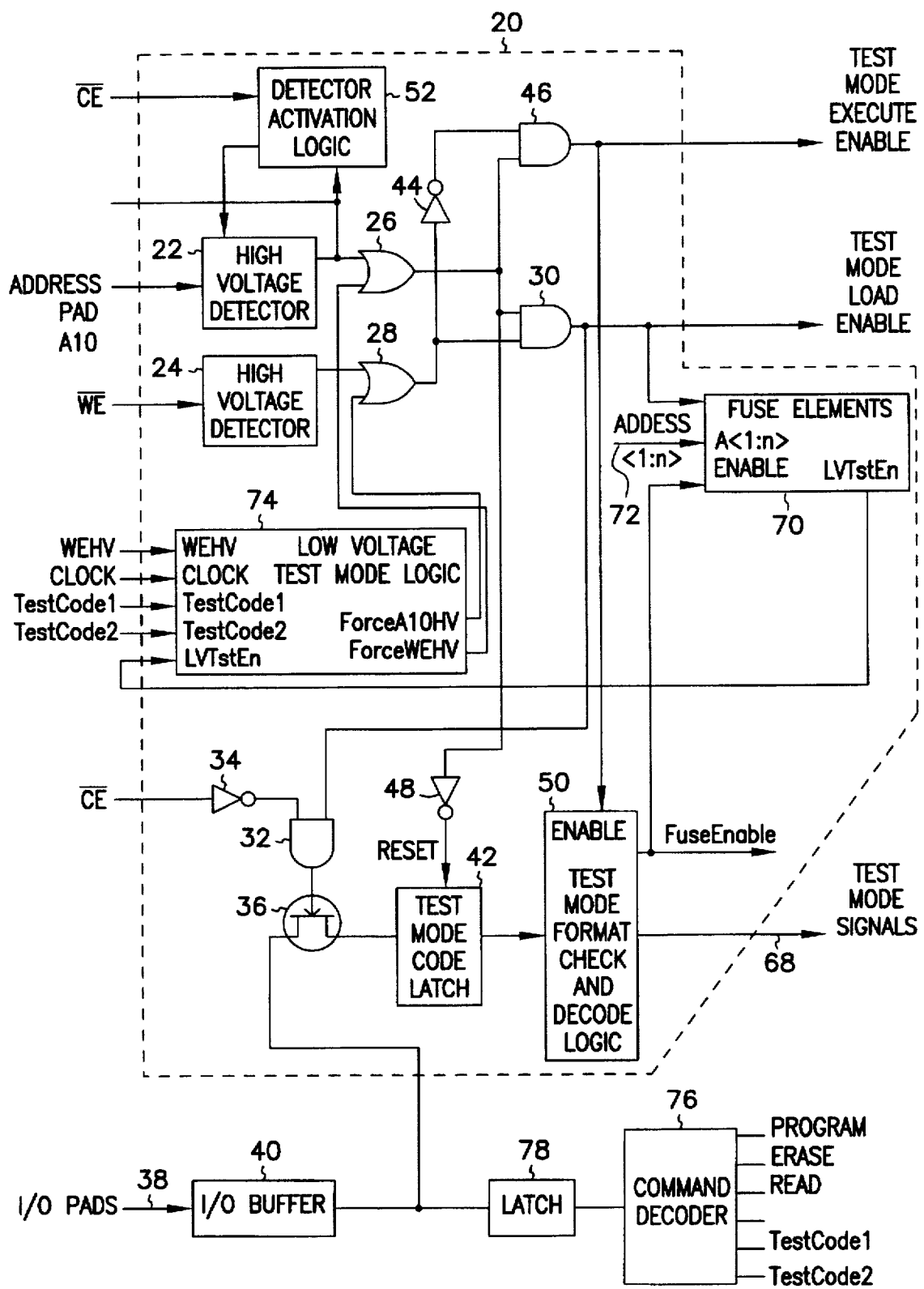
FIG. 1 is a schematic diagram illustrating a test mode circuit in accordance with the present invention.

Referring to FIG. 1, there is illustrated a test mode circuit 20 in accordance with the present invention. The circuit 20 has a wide variety of applications in circuits or parts that use test modes or signals. For example, the circuit 20 may be used for generating test modes or signals in digital memories, such as, EPROMs, flash EPROMs, EEPROMs, DRAMs, and SRAMs.

As mentioned above, the circuit 20 has two basic modes of operation, or in other words, two basic ways in which test mode codes can be loaded and executed. The first is a high voltage mode of operation, and the second is a low voltage mode of operation. The high voltage mode of operation will be described first.

In order for a test mode code to be loaded into the circuit 20 via the high voltage mode of operation, the following steps are taken. First, high voltages are applied to two or more pins, such as for example, the write enable pin $\overline{WE}$ and a preselected one of the address pins, such as for example, address pin A10. It should be understood that the specific pins which are chosen to receive the high voltages is not critical and that other pins may be used. As will be discussed below, the high voltage which may be used to trigger the high voltage mode of operation may be on the order of about 9.0 Volts.

The high voltages on pins $\overline{WE}$ and A10 are detected by detectors 22, 24, respectively, which may be implemented with known detector circuits. A suitable detector circuit is disclosed in application Ser. No. 08/493,162 filed on Jun. 21, 1995 and entitled INTEGRATED CIRCUIT HAVING HIGH VOLTAGE DETECTION CIRCUIT, the contents of which are hereby fully incorporated into the present application by reference. The outputs of the detectors 22, 24 are used as inputs for OR gates 26, 28, respectively. The outputs of the OR gates 26, 28 are connected to the inputs of an AND gate 30. The output of the AND gate 30 will be high only if the detectors 22, 24 detect high voltages on both the $\overline{WE}$ and A10 pins. Furthermore, the output of the AND gate 30 is the test mode load enable signal which indicates to the rest of the part that a test mode code may be transferred into the test mode code data latch 42.

The output of the AND gate 30 is coupled to the input of another AND gate 32. The other input of the AND gate 32 is coupled to the output of an inverter 34 which receives the chip enable signal $\overline{CE}$ at its input. In order to load a test mode code into the circuit 20, $\overline{CE}$ is brought low and the appropriate test mode code is placed on I/O lines 38. Data on the I/O lines 38 is transferred into the I/O buffer 40. When the output of the AND gate 30 is high and $\overline{CE}$ is low, the AND gate 32 turns on transistor 36. This allows the test mode code to be transferred into a test mode code latch 42.

The AND gate 30 ensures that both the $\overline{WE}$ and A10 lines are at high voltage in order to initiate the loading of a test mode code into the test mode code latch 42. The AND gate 32 ensures that the output of the AND gate 30 is high and that $\overline{CE}$ is low in order for the transistor 36 to be turned on. The transistor 36 functions as a switch to transfer the test mode code from the I/O buffer 40 to the test mode code latch 42.

When $\overline{CE}$ goes high, one input of the AND gate 32 goes low which causes the transistor 36 to turn off. Because the transistor 36 is turned off, any new data which is received by the I/O buffer 40 will not be transferred to the test mode code latch 42. The latch 42 preferably includes eight, one-bit latches arranged in parallel. On the high going edge of $\overline{CE}$, the test mode code is latched into a test mode code latch 42. Since two or more pins $\overline{WE}$ and A10 must be at high voltage at the same time during the loading of the test mode code, this affords the hardware protection during loading of the test mode code.

After a test mode code has been latched into the test mode code latch 42, the next step is to execute the specific test mode which corresponds to the test mode code. In order to execute the test mode, the high voltage is removed from A10. This causes the output of the OR gate 28 to go low. The output of the OR gate 28 is coupled through an inverter 44 to another AND gate 46. When the high voltage is removed from A10 the output of the inverter 44 goes high. Assuming that the high voltage is still being applied to WE, the output of the AND gate 46 goes high. The output of the AND gate 46 is the Test Mode Execute Enable signal. This signal enables the part to execute the test mode corresponding to the test mode code that is latched in the test mode code latch 42.

Thus, in order to execute a test mode, some of the pins in the part that were at high voltage must be brought down to normal operating ranges after the test mode code is entered. Specifically, in the test mode circuit 20, A10 is brought down to the normal operating range. Furthermore, at least one of the pins must remain at the high voltage level during the entire duration of the test mode. Specifically, in the test mode circuit 20, a high voltage continues to be applied to $\overline{WE}$ during the test mode. If the high voltage is removed from WE, the entire test mode is discontinued and all latches are reset. Therefore, two pins are preferably at a high voltage to load the test mode code, and then one of the pins is brought to a low voltage to shut off the loading.

The detectors 22, 24 operate under a type of hysteresis effect controlled by $\overline{WE}$. The detector 22 is enabled upon by $\overline{WE}$ obtaining a first predetermined high voltage, such as 9.0 volts. Once enabled, the detector 22 remains operational unless $\overline{WE}$ falls below a second predetermined voltage, such as 8.0 volts. Therefore, when the detector 22 is activated, $\overline{WE}$ may fluctuate slightly without disabling the test mode. If $\overline{WE}$ falls below the second predetermined voltage, the output of the OR gate 26 goes low which causes the output of an inverter 48 to go high. When the output of the inverter 48 goes high, the test mode code latch 42 is reset which disables the test mode.

Figure 2:
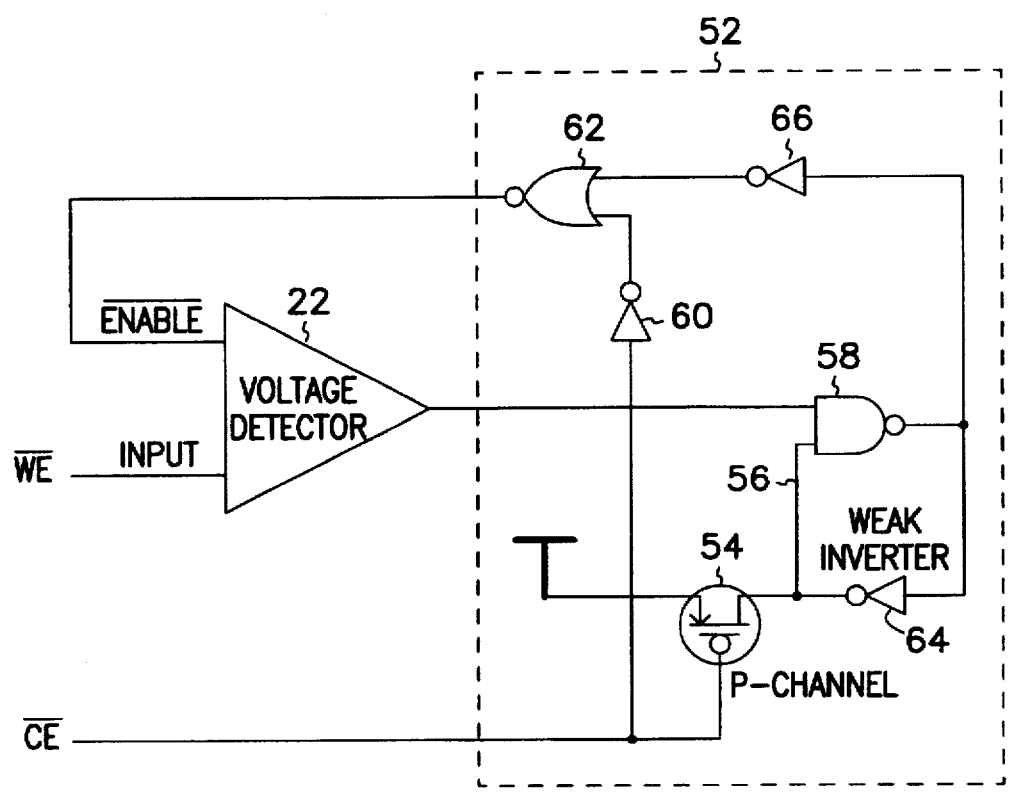
FIG. 2 is a schematic diagram illustrating the detector activation logic and high voltage detector shown in FIG. 1.

FIG. 2 illustrates the detector 22 along with a detector activation logic circuit 52 which may be used in the circuit 20. The detector 22 determines whether a pin has higher voltage than a predetermined voltage, such as 9.0 volts. Since most high voltage detector circuits draw current when enabled, the $\overline{CE}$ signal is typically used to power up the detectors 22, 24. However, the $\overline{CE}$ pin toggles to load the test mode codes into the test mode code latch 42 and decoding logic 50. This will result in the output of the detectors 22, 24 switching from HIGH to LOW at the high-going edge of $\overline{CE}$, and hence, reset the test mode. To prevent this undesired effect, the detector activation logic 52 is used to ensure that once the output of the detectors 22, 24 are asserted during the test mode, $\overline{CE0}$ is no longer used to power up the detectors 22, 24 and that the test mode is not reset unless $\overline{WE}$ falls below a predetermined voltage.

During the execution of the test mode, the $\overline{CE}$ pin will typically toggle. If the test mode load enable signal is still high, the code that is on the I/O lines 38 will override the test mode code in the test mode code latch 42. In order to resolve this issue, at least one of the pins that was previously at high voltage, e.g., A10, is brought to normal operating range between, Ov and Vcc. The part will stay in the test mode as long as the $\overline{WE}$ pin is kept at high voltage. As soon as $\overline{WE}$ pin is no longer at high voltage, the test mode code latch 42 is reset and the chip is no longer in test mode. This will ensure that if a high voltage is applied to the $\overline{WE}$ pin due to noise, the part will not stay in the test mode unless a DC voltage higher than the supply voltage is continuously applied to it. This provides the hardware protection during the execution of the test mode. The fact that two or more pins have to be at high voltage at the same time during the loading of the test mode code provides the hardware protection of that stage.

The logic circuit 52 is initially activated by the $\overline{CE}$ signal, which turns on transistor 54 and raises the voltage at input 56 of the NAND gate 58. The $\overline{CE}$ signal also enables the detector 22 through the inverter 60 and the NOR gate 62. Once the output of the detector 22 is asserted, signifying that $\overline{WE}$ is at a high voltage, both inputs of the NAND gate 58 are high. The NAND gate 58 sets a latch to keep the detector 22 powered up even if $\overline{CE}$ toggles or changes value. The latch is formed by the NAND gate 58 and the weak inverter 64. This ensures that if the $\overline{CE}$ signal toggles after setting the latch, the internal test mode execute enable signal remains valid as long as $\overline{WE}$ remains at a high voltage. This latch is reset if the $\overline{WE}$ signal falls below a predetermined voltage.

Accordingly, the detector activation logic circuit 52 ensures that if the $\overline{WE}$ pin obtains a high voltage on it due to noise, the circuit 20 will not stay in the test mode unless a DC voltage higher than the predetermined voltage remains on the $\overline{WE}$ pin. This provides the hardware protection during the execution of the test mode.

The output of the AND gate 46, i.e., the test mode execute enable signal, also enables the test mode format check and decode logic 50. The decode logic 50 performs test mode format checking and decoding. Specifically, the test mode code is compared with decoding logic against predetermined codes and code formats in order for the part to enter the desired mode. Test mode data is provided to the rest of the part via the test mode signals 68.

The test mode codes are preferably of a specific format. The codes and their format are preferably sufficiently different than regular commands used to issue activities in the chip. This reduces the possibility of an end user mistakenly entering test modes. The test mode code is typically divided into two groups of bits. The first is a set of bits that have the same value for a set of different test codes. This section of the code is referred to as the format.

Figure 3:
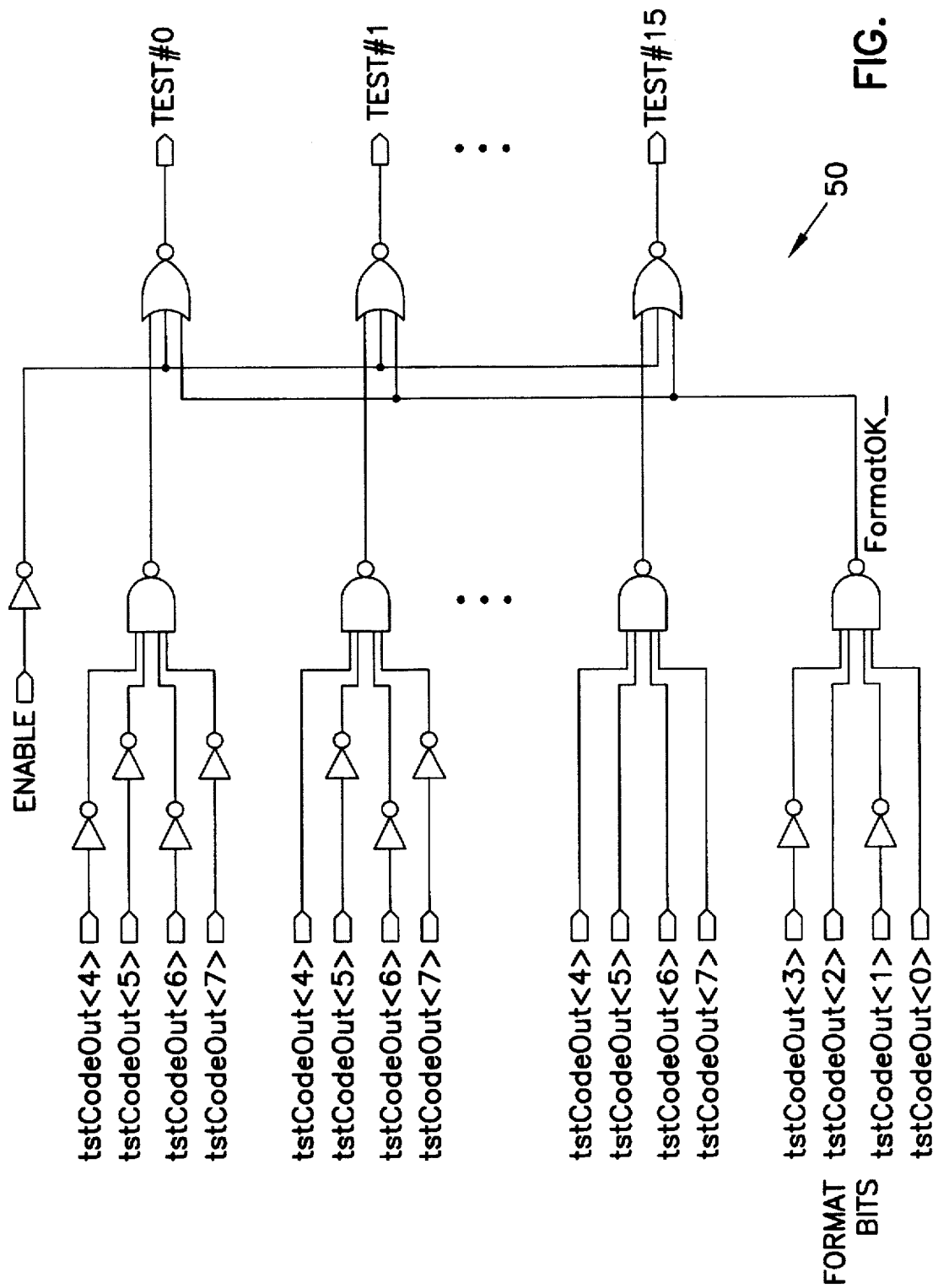
FIG. 3 is a schematic diagram illustrating the test mode format check and decode logic shown in FIG. 1.

The other bits in the test mode code are used to decode the different test modes. This feature not only makes it safer to keep the test mode codes different from the regular commands, it reduces the circuitry needed to decode the different test modes. By having only one detector for the format bits, that portion of the code requires only one decoder, as opposed to one for each code. For example, if the circuit requires that bits 0–3 of the code be the Hexadecimal value "A", only one four-bit decoder is required to identify the format. Other four-bit decoders are needed for bits 4–7. The output of those decoders is ANDed with the output of the single format decoder. FIG. 3 shows a circuit which may be used as the decode logic 50.

As mentioned above, the test mode circuit 20 has a low voltage mode of operation. In general, once the circuit 20 is in the low voltage mode of operation, test mode codes can be loaded and executed without high voltages being applied to the $\overline{WE}$ and A10 pins. The circuit 20 is placed in the low voltage mode of operation by first going through the regular high voltage mode of operation to load a test mode code which enables a data storage device 70 via a FuseEnable signal. The data storage device 70 includes a non-volatile data storage unit, which will be discussed in detail below, which generates a low voltage enable signal LVTstEn. Once the data storage device 70 is enabled, the specific non-volatile data storage unit corresponding to the low voltage enable signal LVTstEn is set by loading the appropriate value through the address lines 72. Again, the structure and operation of the non-volatile data storage unit included in the data storage device 70 will be discussed in detail below.

The low voltage enable signal LVTstEn enables the low voltage test mode logic 74. The low voltage test mode logic 74 allows test mode codes to be loaded into the test mode latch 42 and executed with a sequence of commands through software only. This allows the part to be powered down and tested in machines that do not have high voltage capability. Additionally, such low voltage test modes may be easier or faster to execute when there is no need for high voltages.

The low voltage test mode logic 74 includes two outputs: ForceWEHV and ForceA10HV. These outputs are connected to the inputs of the OR gates 26, 28, respectively, along with the outputs of the detectors 22, 24, respectively. A sequence of commands with the TestCode1 and TestCode2 inputs will set two registers inside the low voltage test mode logic 74 that will cause ForceWEHV and ForceA10HV to go high and low in order to mimic the outputs of the detectors 22, 24. Because ForceWEHV and ForceA10HV are ORed with the output of the detectors 22, 24, high voltages are not required to be applied to the $\overline{WE}$ and A10 pins. Instead, ForceWEHV and ForceA10HV take the place of the outputs of the detectors 22, 24 in order to turn the transistor 36 on and off.

Thus, the details as to how the test mode codes are loaded and executed is very much like when the circuit 20 is in the high voltage mode of operation. In other words, the low voltage test mode logic 74 raises and lowers the ForceWEHV and ForceA10HV signals in order to first load a test mode code into the test mode code latch 42, and then to raise the test mode execute enable signal for execution of the test mode code.

The TestCode1 and TestCode2 signals are generated by the normal mode command decoder 76 of the part in which the test mode circuit 20 is included. Specifically, during normal operation of the part, i.e., non-test mode operation, commands are received by a latch 78 via the input lines 38 and the I/O buffer 40. The commands are transferred from the latch 78 to the normal mode command decoder 76. Most of the outputs of the normal mode command decoder 76 are for controlling the normal functions of the part, such as for example, program, erase, and read operations. In addition to the normal mode command decoder 76's normal outputs, the TestCode1 and TestCode2 signals are also added.

Because the TestCode1 and TestCode2 signals are generated by the normal mode command decoder 76, they can be controlled without having to turn the transistor 36 on and off. In other words, the TestCode1 and TestCode2 signals can be controlled in the same manner as the normal functions of the chip, i.e., through software only. And because the TestCode1 and TestCode2 signals control the ForceWEHV and ForceA10HV signals, the transistor 36 can be turned on and off by software only. This permits test mode codes to be loaded into the test mode code latch 42 by software only. It should be remembered, however, that such loading of the test mode code latch 42 by software only is possible only when the low voltage test mode logic 74 is enabled via the low voltage test mode enable signal LVTstEn. And the low voltage test mode enable signal LVTstEn can only be set by the high voltage mode of operation. This provides a hardware protection against accidental user entry of a test mode.

Figure 4:
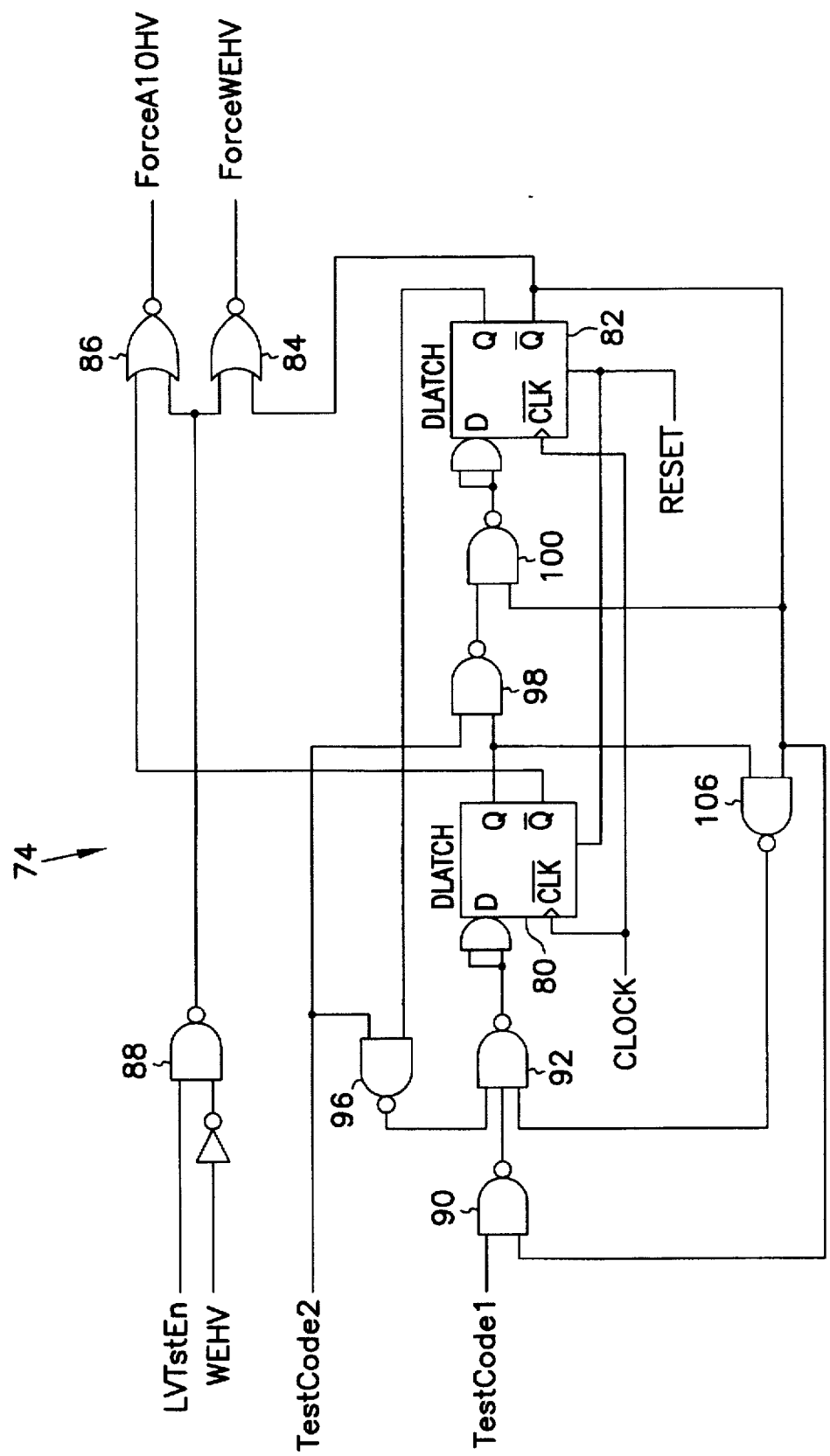
FIG. 4 is a schematic diagram illustrating the low voltage test mode logic shown in FIG. 1.

Referring to FIG. 4, the low voltage test mode logic 74 includes two latches 80, 82. The ForceWEHV and ForceA10HV signals are generated by two NOR gates 84, 86, respectively. A NAND gate 88 receives at its inputs the LVTstEn signal and an inversion of the output of the high voltage detector 22, indicated as the WEHV signal. The WEHV signal goes high when the high voltage detector 22 has detected a high voltage on the $\overline{WE}$ pin. When a high voltage is detected on the $\overline{WE}$ pin the execution of low voltage test modes is disabled because the presence of a high voltage on the $\overline{WE}$ pin implies that high voltages are available and testing can be done in the high voltage test mode. When the LVTstEn signal is high and the WEHV signal is low, the output of the NAND gate 88 is low. This means that the outputs of the NOR gates 84, 86, i.e., the ForceWEHV and ForceA10HV signals, are controlled by the Q_ outputs of the latches 82, 80, respectively.

Figure 5:
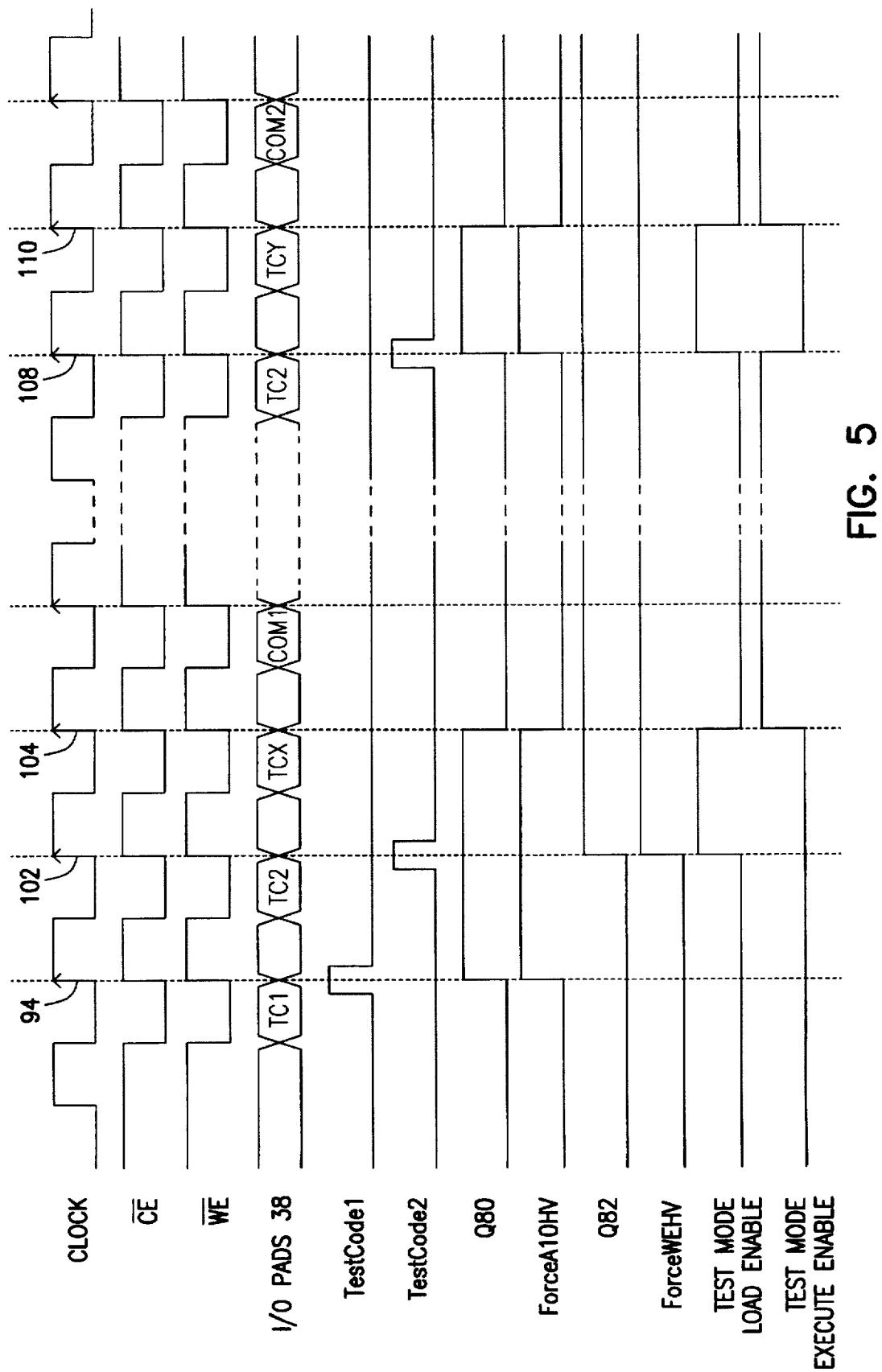
FIG. 5 is a timing diagram illustrating the operation of the test mode circuit shown in FIG. 1.

FIG. 5 illustrates the operation of the low voltage test mode logic 74. As discussed above, in order for the low voltage test mode logic 74 to be operational, the low voltage enable signal LVTstEn must be high. The following discussion assumes that a test mode code has first been loaded via the high voltage mode of operation discussed above and that the non-volatile data storage unit corresponding to the low voltage enable signal LVTstEn in the data storage device 70 has been set. This can be done using a tester that has high voltage capability. Once these steps have been taken the high voltages can be removed from the $\overline{WE}$ and A10 pins.

In general, the low voltage test mode logic 74 operates by raising the TestCode1 and TestCode2 signals at the appropriate times which raises and lowers the ForceA10HV and ForceWEHV signals in order to mimic the $\overline{WE}$ and A10 signals. Referring to FIG. 5, the clock signal is generated by the control logic of the part into which the circuit 20 is incorporated. In order to load a code into the latch 78 via the I/O pads 38, the write enable $\overline{WE}$ and chip enable $\overline{CE}$ signals are brought low. A first test code TC1 is placed on the I/O pads 38. The first test code TC1 is decoded by the command decoder 76, and the command decoder 76 raises the TestCode1 signal in response thereto.

The TestCode1 signal is coupled to one input of a NAND gate 90. The other input of the NAND gate 90 is coupled to the output Q_82 of the latch 82. Because the latch 82 is initially reset, both inputs of the NAND gate 90 are high causing it to have a low output. The low output of the NAND gate 90 results in the NAND gate 92 having a high output. Thus, the TestCode1 signal results in a high signal being received at the D-input of the latch 80 during the rising edge 94 of the clock signal. This causes the output Q80 of the latch 80 to go high and the output $\overline{Q}80$ to go low. The output $\overline{Q}80$ is coupled to the NOR gate 86. When the output $\overline{Q}80$ goes low, the ForceA10HV signal goes high.

Next, the write enable $\overline{WE}$ and chip enable $\overline{CE}$ signals are brought low again and a second test code TC2 is placed on the I/O pads 38. The second test code TC2 is loaded into the latch 78 and is decoded by the command decoder 76. The command decoder 76 raises the TestCode2 signal in response thereto. The TestCode2 signal is coupled to one input of a NAND gate 96 and another NAND gate 98. The output of the NAND gate 98 is coupled through a NAND gate 100 to the D-input of the latch 82. The Q80 output of the latch 80 is coupled to the other input of the NAND gate 98, and the $\overline{Q}82$ output of the latch 82 is coupled to the other input of the NAND gate 100.

Because the latch 80 has already been set, both inputs of the NAND gate 98 are high when TestCode2 goes high. This results in the NAND gate 98 having a low output which causes the output of the NAND gate 100 to be high. Thus, the D-input of the latch 82 is high during the rising edge 102 of the clock. This causes the latch 82 to be set resulting in the Q82 output going high and the $\overline{Q}82$ output going low. Because the $\overline{Q}82$ output is coupled to the NOR gate 84, the ForceWEHV signal goes high on the rising edge 102 of the clock. With $\overline{Q}82$ being high and Q80 being high the output of NAND gate 106 will be low which through NAND gate 92 will cause the input of latch 80 to be high. Thus, on the rising edge 102 of the clock, latch 80 will be set again and Q80 will remain high.

At this point, i.e., just after the rising edge 102 of the clock, both the ForceA10HV and ForceWEHV signals are high. This causes the outputs of the OR gates 26, 28 to be high, resulting in the output of the AND gate 30, i.e. the Test Mode Load Enable signal, going high. When the $\overline{CE}$ and $\overline{WE}$ signals are brought low again, the output of the AND gate 32 will go high and the transistor 36 will turn on. This allows a regular test mode code TCX which is placed on the I/O pads 38 to be transferred to the test mode code latch 42. Thus, the first and second test mode codes TC1, TC2 were used to turn the transistor 36 on so that the regular test mode code TCX could be loaded into the test mode code latch 42 without high voltages having to be applied to the $\overline{WE}$ and A10 pins.

After the latch 82 has been set, the $\overline{Q}$ 82 output is low which results in the output of the NAND gate 100 remaining high. Because the NAND gate 100 holds the D-input of the latch 82 high, the latch 82 will remain set until it is reset via the Reset line. Thus, the output $\overline{Q}82$ and the ForceWEHV signals remain high after the rising edge 102 of the clock.

The $\overline{Q}82$ output of the latch 82 is also coupled to one input of a NAND gate 106. The output of the NAND gate 106 is high because the $\overline{Q}82$ output is low. Furthermore, once the TestCode2 signal returns low, the output of the NAND gate 96 goes high, and, because the TestCode1 signal is already low, the output of the NAND gate 90 is high. Thus, all three inputs of the NAND gate 92 are high which results in a low signal being applied to the D-input of the latch 80 during the rising edge 104 of the clock. This results in the latch 80 being reset which causes the ForceA10HV signal to go low.

When the ForceA10HV signal goes low the output of the OR gate 28 goes low which pulls one input of the AND gate 32 and the Test Mode Load Enable signal low. This turns the transistor 36 off so that the regular test mode code TCX is latched in the test mode code latch 42. Additionally, the output of the AND gate 46, i.e., the Test Mode Execute Enable signal, goes high indicating that commands can now be placed on the I/O pads 38 which will be transferred to the latch 78, decoded by the command decoder 76, and executed by the part. For example, the command COM1 can be placed on the I/O pads 38 after the rising edge 104 of the clock. Because the part is in the test mode corresponding to the test mode code TCX, the command COM1 will be executed pursuant to that test mode.

After the test mode corresponding to the test mode code TCX has been executed, it may be necessary to change the test mode. This is done by loading a different test mode code, such as the test mode code TCY, into the test mode code latch 42. In order to load a new test mode code into the test mode code latch 42, the second test code TC2 is again loaded into the latch 78. The normal mode command decoder 76 raises the TestCode2 signal in response thereto. When the TestCode2 signal goes high the output of the NAND gate 96 goes low which causes the output of the NAND gate 92 to go high. On the rising edge 108 of the clock the latch 80 is set which causes the ForceA10HV and Test Mode Load Enable signals to go high again. This causes the transistor 36 to turn on so that the test mode code TCY can be loaded into the test mode code latch 42 at the rising edge 110 of the clock.

Similar to above, the TestCode2 signal returns low so that all inputs of the NAND gate 92 are high which results in the D-input of the latch 80 being low. On the rising edge 110 of the clock, the latch 80 is reset and the ForceA10HV signal goes low again, along with the Test Mode Load Enable signal. The Test Mode Execute Enable signal goes high which permits commands, such as the command COM2, to be transferred to the latch 78 and executed.

In summary, the latch 80 is set when the first test code TC1 is loaded, and the latch 82 is set when the second test code TC2 is loaded. The NAND gate 106 keeps the input to the latch 80 high which makes sure that it stays set. The output of the two latches 80, 82 corresponds to the output of the high voltage detectors for A10 and $\overline{WE}$. After the second test code TC2 is loaded it appears as if $\overline{WE}$ and A10 are both at high voltage which is the same as the test mode initiation in the high voltage mode.

After the first and second test codes TC1, TC2 have been entered, a regular test mode code TCX is entered which will generate another clock cycle. The latch 82 stays set through the NAND gate 100; in other words, once the output of the latch 82 is set, its input is forced high and hence it will stay at a high logic level unless a Reset signal is received. The latch 80, however, will get reset since the TestCode2 signal is not available in this cycle. The output of the latch 80 corresponds to the pin A10 being at high voltage level.

As mentioned before, in the high voltage mode, the A10 pin needs to be brought low before test mode execution can proceed. In the low voltage test mode logic 74, upon receiving of the test code in the third cycle, i.e., the rising edge 104, the latch 80 is reset and the circuit treats this as the voltage on the A10 pin is brought low. After this the execution can commence. If a second, different test mode is to be started, all one needs to do is to enter the second test code TC2 again and the ForceA10HV signal will go high which is like bringing the A10 pin to high voltage. Another regular test code TCY can then be supplied through the I/O pins 38. After that, the ForceA10HV signal will go low again on the rising edge 110.

Prior to sending the part to the customer or the end user, the first and second test codes TC1, TC2 will be entered again, and then a test mode code which permits the data storage device 70 to be modified will be loaded into the test mode code latch 42. The non-volatile data storage unit corresponding to the low voltage test enable signal LVTstEn will be reset via the address lines 72 to bring the value of the LVTstEn signal low. As can be seen in FIG. 4, when the LVTstEn signal is low the two signals ForceWEHV and ForceA10HV will stay low via the NOR gates 84, 86 and execution of normal software sequences will not affect the test mode circuit 20.

The data storage device 70 includes a non-volatile data storage unit 190 that stores the control parameter corresponding to the low voltage test enable signal LVTstEn. The non-volatile data storage unit 190 can be implemented in many forms, such as the type described in U.S. patent application Ser. No. 08/508,864, filed Jul. 28, 1995, entitled "NON-VOLATILE DATA STORAGE UNIT AND METHOD OF CONTROLLING SAME", and U.S. patent application Ser. No. 08/508,828, filed Jul. 28, 1995, entitled "MEMORY SYSTEM HAVING PROGRAMMABLE CONTROL PARAMETERS", the contents of which are fully incorporated herein by reference. These applications disclose a non-volatile data storage unit having flash memory cells which permit certain control parameters to be programmed to a desired state after fabrication of the memory system has been completed.

Figure 6:
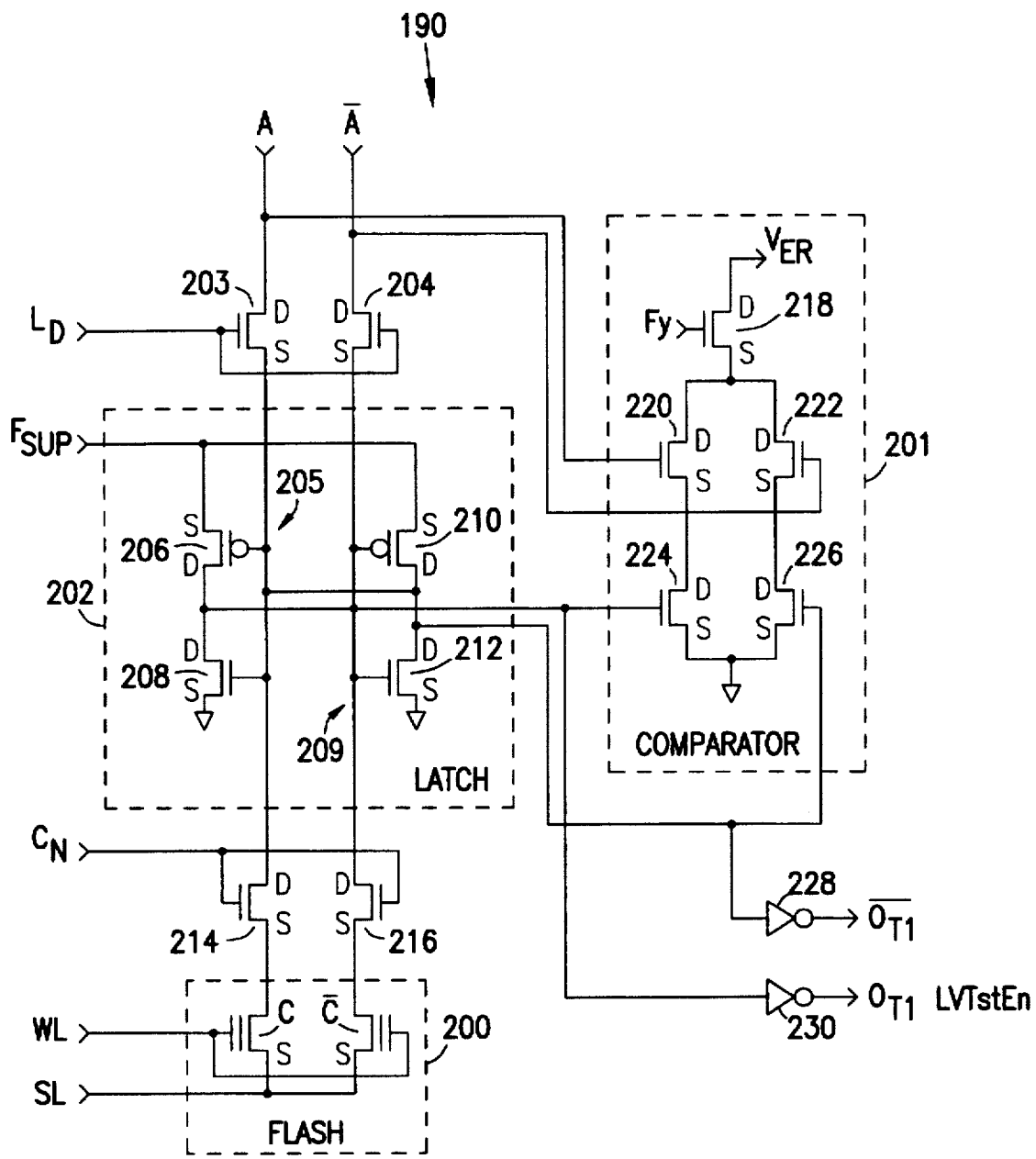
FIG. 6 is a schematic diagram illustrating a non-volatile data storage unit which is included in the data storage device shown in FIG. 1.

FIG. 6 is a detailed schematic diagram of a non-volatile data storage unit 190 suitable for use in connection with the present invention for storing the control parameter corresponding to the low voltage test enable signal LVTstEn. The data storage unit 190 is capable of storing a single bit of control parameter data. Multiple bits can be stored by simply providing a separate storage unit 190 for each bit. The storage unit includes a non-volatile memory or flash section 200, a volatile latch section 202 and a comparator section 201. The flash section includes a pair of flash memory cells C and $\overline{C}$ for storing one bit of control parameter data in complementary form. As is well known, a flash cell utilizes a floating gate transistor having a drain, source, floating gate and control gate. Data is stored in the cell by adding or removing charge from the floating gate. Erasure is accomplished by removing charge by way of Fowler-Nordheim tunneling from the floating gate through a thin gate oxide disposed intermediate the floating gate and the cell channel. The flash cells have their common source regions connected to a common source line which receives signal $S_L$ and their control gates connected to a common word line which receives signal $W_L$.

The latch section 202 includes a pair of cross-coupled inverters which form a latch circuit. A first inverter 205 includes a P channel transistor 206 connected in series with an N channel transistor 208. The common drain connections of transistors 206 and 208 form the output of the inverter and the common gate connection form the input. The second inverter 209 includes a P channel transistor 210 connected in series with an N channel transistor 212. The common drain connection of transistors 210 and 212 form the output of the second inverter 209 and the common gate connection forms the input.

As previously noted, the two inverters of the latch section 202 are connected to form a latch circuit. In particular, the output of the first inverter 205, the common drain connection of transistors 206 and 208, is connected to the input of the second inverter 209, the common gate connection of transistors 210 and 212. The output of the second inverter 209, the common drain connection of transistors 210 and 212, is connected back to the input of the first inverter 205, the gates of transistors 206 and 208.

The output of the first inverter 205 of the latch section 202 is connected to the drain of flash cell $\overline{C}$ by way of a N channel transistor 216 and the output of the second inverter 209 is connected to the drain of flash cell C by way of N channel transistor 214. The gates of the two connect transistors 214 and 216 are connected to a common control line which carries signal $C_N$.

The latch section 202 is powered by applying a voltage $F_{SUP}$ to the sources of transistors 206 and 210. As will be explained, the magnitude of the voltage $F_{SUP}$ can be controlled by conventional circuitry, the details of which are not described since they are conventional and form no part of the present invention.

Data to be loaded into the latch section 202 is provided in complementary form A and $\overline{A}$ by way of N channel transistors 203 and 204. One of the address lines <1:n> 72 shown in FIG. 1 corresponds to A shown in FIG. 6. The common gates of the transistors 203 and 204 are connected to a line which receives a load signal $L_D$. Transistor 203 functions to couple data input A to the input of the first inverter 205 of latch section 202 and transistor 204 functions to couple data input $\overline{A}$ to the input of the second inverter 209.

The two complementary outputs of the latch section 202 are coupled to respective inverters 228 and 230. The outputs of inverters 228 and 230 form the complementary outputs $\overline{O}_{T1}$ and $O_{T1}$ of the subject data storage unit. The output $O_{T1}$ corresponds to the LVTstEn signal shown on the storage device 70. The outputs of the latch section 202 are also coupled to respective inputs of a comparator circuit 201. The data inputs A and $\overline{A}$ are also coupled to respective inputs of the comparator circuit 201. As will be explained, the comparator circuit 201 functions to compare the data stored in the latch section 202 with the data inputs A and $\overline{A}$ so that the state of the latch section can be verified. Typically, the output of the comparator section 201, signal $V_{ER}$ is wire ORed to other comparator sections 201 associated with other data storage units so that a single verification signal $V_{ER}$ can be used to indicate whether there is a match between the contents of the latch section 202 and the associated data inputs A and $\overline{A}$ among several of the subject storage units.

Comparator section 201 includes five N channel transistors 218, 220, 224, 222 and 226. Transistor 218 is coupled between the comparator output $V_{ER}$ and the common drain connection of transistors 220 and 222. In addition, the gate of transistor 218 is connected to receive signal $F_V$ which is active when the state of the comparator section 201 is to be sampled. Transistors 220 and 224 are connected in series, with the gate of transistor 224 connected to receive data input A and the gate of transistor 224 connected to receive the output of the first inverter 205 of latch section 202. Similarly, transistors 222 and 226 are connected in series, with the gate of transistor 222 connected to receive data input $\overline{A}$ and the gate of transistor 226 connected to receive the output of the second inverter 209 of latch section 202. As will be explained, when the complementary data inputs A and $\overline{A}$ match the complementary outputs of the two latch section inverters, the output of the comparator circuit 201, $\overline{V}_{ER}$ will be high, otherwise the output will be low.

There are a total of five operations which the subject storage unit 190 can perform, including Load, Erase, Program, Recall and Verify. These operations will each be described in connection with the timing diagram of FIG. 7 together with the schematic diagram of FIG. 6. As will be explained in greater detail, the flash cell C and $\overline{C}$ are programmed by first loading the programming data into the latch section 202. In addition, the flash cells C and $\overline{C}$ are read by transferring the contents of the flash cells to the latch section 202.

Load The function of the Load cycle is to set the latch section 202 to a known state based upon the complementary input data A and $\overline{A}$. The Load operation is required prior to the Program operation to ensure that the latch circuit 202 is at the desired state.

The beginning of the Load cycle is indicated by time $T_0$. Following time $T_0$, the input data A and $\overline{A}$ is applied to the drains of transistors 203 and 204. Once the input data are stabilized, the load signal $L_D$ is made active thereby turning on transistors 203 and 204. In addition, the latch section 22 supply voltage $F_{SUP}$ is maintained at its nominal primary supply voltage $V_{CC}$ level of +5 volts. Assuming, for example, that A is a high level, the input of the first inverter 205, the common gates of transistors 206 and 208 will be pulled up to a high level. At the same time, complementary signal $\overline{A}$ will be at a low level and will tend to pull the input of the second inverter 209, the gates of transistors 210 and 212, down to a low level by way of load transistor 204.

This combined opposing action on the inputs of the two inverters will force the output of the first inverter 205 to a low state and the output of the second inverter 209 to a high state. The latch section 202 will hold or store this data until it is altered by a subsequent Load operation, until it is changed by a Recall operation (as will be explained) or until the power is removed from the system. Load transistors must be of sufficient size so as to be capable of forcing the latch section 202 transistors to the desired state.

Erase The operation for erasing the flash cells C and $\overline{C}$ commences at time $T_1$. This cycle is performed directly on the cells rather than by way of the latch section 202. The connect signal $C_N$ is inactive in this operation so that both connect transistors 214 and 216 will be non-conductive. Thus, the drains of cells C and $\overline{C}$ will be left floating. In addition, signal $W_L$ connected to the word line of the two cells is grounded and the signal $S_L$ connected to the sources of the two cells is raised to a large positive voltage such as +12 volts. As is well known, under these conditions, the cells C and $\overline{C}$ will both be erased by way of Fowler-Nordheim tunneling. The flash section 200 must then be appropriately programmed so that the cells C and $\overline{C}$ will store complementary data.

Program The Programming cycle commences at time $T_2$. As previously noted, the latch section 202 must have been previously set to the desired programmed state of the flash section 10. Load signal $L_D$ is inactive so that transistors 203 and 204 are off. The supply voltage $F_{SUP}$ is at a nominal value of +6 volts. Assume, for example, that the latch section 202 had previously been set such that the output of inverter 205 is at a low level and the output of inverter 209 is at a high level. In that event, the drain of transistor 214 will be close to the supply voltage $F_{SUP}$ and the drain of transistor 216 will be close to the circuit common.

The connect signal $C_N$ is made active (high) shortly after time $T_2$, thereby turning on transistors 214 and 216 and effectively connecting the supply voltage $V_{SUP}$ and circuit common to the drain of cells C and $\overline{C}$, respectively. The connect signal $C_N$ switches to a high level of +12 volts in the Programming cycle so that transistors 214 and 216 have a sufficient gate-source voltage to connect the supply voltage $F_{SUP}$ of +6 volts to either one of the drains of cells C and $\overline{C}$ depending upon the data stored in the latch. In this case, cell C will get the $F_{SUP}$ on its drain. At the same time, the control gates of the cells C and $\overline{C}$ are connected to word line signal $W_L$ having a magnitude equal to +12 volts. In fact, in many cases $C_N$ and $W_L$ can be the same signal. The source line signal $S_L$ is at circuit common and is connected to the common sources of cells C and $\overline{C}$. This combination of voltages applied to cell C will cause the cell to be programmed whereas those applied to cell $\overline{C}$ will not result in programming of the cell. In order to enable the cells C and $\overline{C}$ to be programmed to opposite states, it is necessary to first erase both cells in an Erase cycle prior to performing the Programming cycle. As previously noted, the latch section 202 must have also been previously set in order to carry out a Programming cycle.

Transistor 210 of inverter circuit 209 will provide the programming current, which is typically 500 microamperes, to cell C. If cell $\overline{C}$ is being programmed, the programming current is provided by transistor 206 of inverter circuit 205. Thus, transistors 206 and 210 of the latch section 202 must be of sufficient size to be able to conduct these programming currents. As previously noted, transistors 203 and 204 must also be sized so that they have sufficient strength to force transistors 206 and 210 to a desired state during the Load cycle. Typically, the programming voltages will be applied for a relatively long duration ranging from a few hundred microseconds to a millisecond. Since the data is stored in cells C and $\overline{C}$ in complementary form and since, as will be explained, the cells will be read in a differential manner, there is a large error tolerance margin. Accordingly, it is not necessary to perform any type of program verification as is frequently done in flash memory systems to confirm that the data has been properly programmed.

Figure 7:
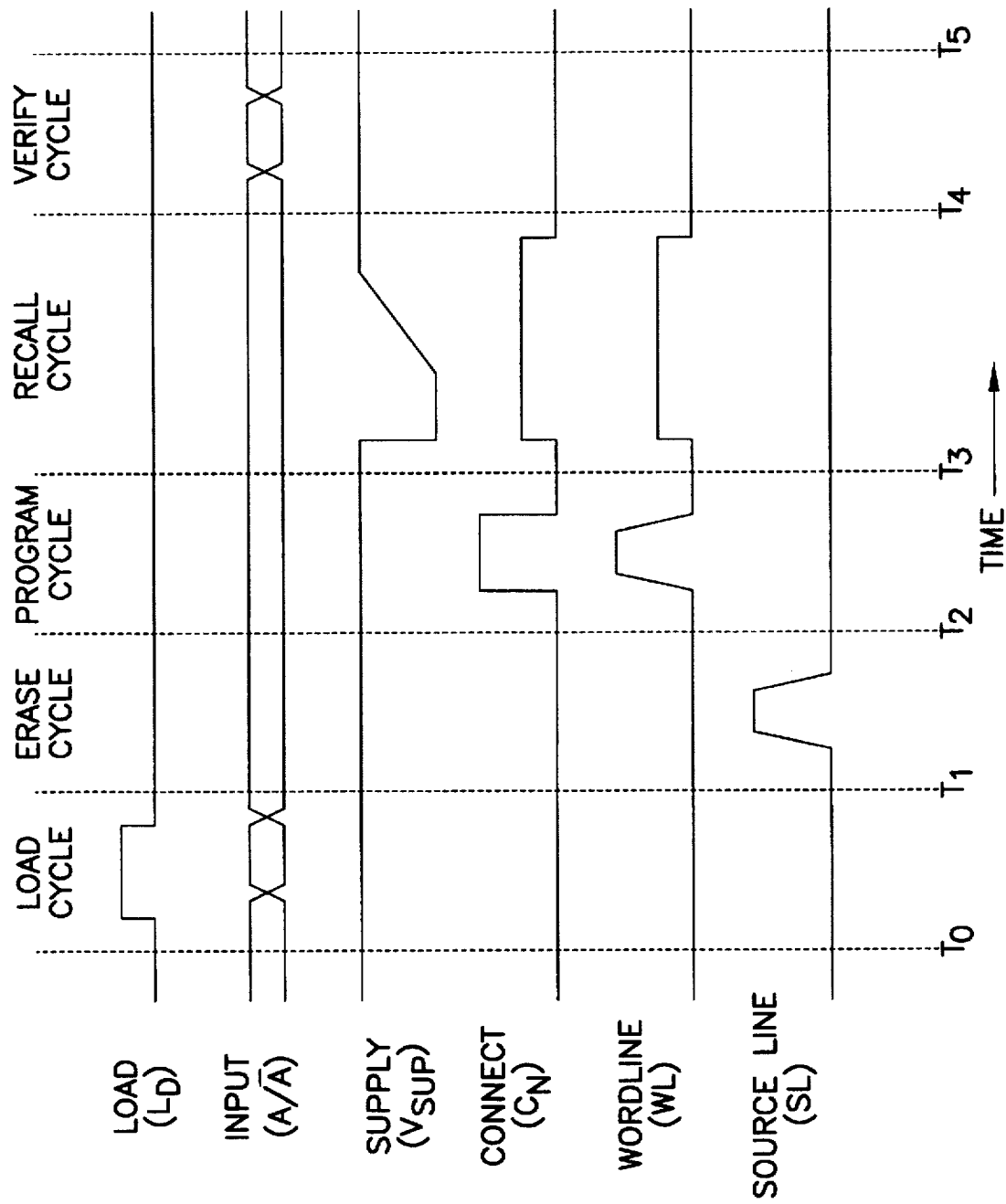
FIG. 7 is a timing diagram illustrating the operation of the non-volatile data storage unit shown in FIG. 6.

Recall The Recall cycle is illustrated in the FIG. 7 diagram beginning at time $T_3$. In this operation, the complementary states of cells C and $\overline{C}$ are transferred to the latch section 202. When power is removed from the data storage unit 190, the data is not retained in volatile latch section 202. Accordingly, when power is reapplied, initialization circuitry is used to cause the transfer of the data stored in the non-volatile cells C and $\overline{C}$ to the latch section 202.

Since the flash cells C and $\overline{C}$ have a limited drive capability and would not normally have sufficient strength to force the transistors of the latch section 202 to a desired state, the supply voltage $V_{SUP}$ is momentarily dropped to a low level approaching ground potential in the initial stage of the Recall operation. In addition, the connect signal $C_N$ is made active thereby connecting the flash section 200 to the latch section 202 by way of transistors 214 and 216. The word line of cells C and $\overline{C}$ is connected to a signal $W_L$ having a magnitude equal to the primary supply voltage $V_{CC}$ of typically +5 volts. Again, signals $W_L$ and $C_N$ can be the same signal for this operation.

The Recall cycle is preferably initiated by some form of power-on-reset circuit which will cause the Recall cycle to be performed at power on and when the primary supply voltage $V_{CC}$ drops to some predetermined level which would possibly affect the state of the latch section 202. The Recall cycle is initiated by the power-on-reset circuit when the circuit has detected that the primary supply voltage $V_{CC}$ has ramped up to about +3 volts after initial power on or has ramped up to about +3 volts after a drop in voltage $V_{CC}$ below that level.

During the Recall cycle, the common source line signal $S_L$ is also set to ground potential. Assuming that cell C has been programmed and cell $\overline{C}$ is in an erased state, cell C will be non-conductive so that the input of inverter 205 of the latch section 202 will not be affected. Cell $\overline{C}$ will be conductive and tend to pull the input of inverter 209 of the latch section 202 down to ground potential.

Since the latch section 202 is not powered at this point, cell $\overline{C}$ is capable of pulling the input of inverter 209 down to a low level despite the limited drive capability of the cells. As can be seen from the FIG. 7 timing diagram, voltage $V_{SUP}$ is held to a low value momentarily and then is increased to the normal operating level. Preferably, the voltage is increased at a slow rate.

As the supply voltage $V_{SUP}$ increases, the cell $\overline{C}$ will continue to hold the input of inverter 209 at a low level so that P channel transistor 210 will proceed to turn on. This will cause the output of inverter 209 to be high which will, in turn, cause the input of inverter 205 to also be high. Thus, transistor 208 of inverter 205 will also begin to turn on thereby causing the output of inverter 205 to go low thereby reinforcing cell $\overline{C}$ in pulling down the input of inverter 209. Eventually, the supply voltage $V_{SUP}$ will be at the normal high voltage of $V_{CC}$ or typically +5 volts and the latch section 202 will be in the desired state of indicating the state of the flash section 200.

Even though cell $\overline{C}$ has a very small drive capability, by controlling the supply voltage $V_{SUP}$ as described, the cell is capable of forcing the latch section 202 to the desired state. Programmed cell C will not have much, if any, tendency to pull the input of inverter 205 down and thus will not oppose the action of cell $\overline{C}$. However, even if the programmed threshold voltage of cell C approached the erased threshold voltage of cell $\overline{C}$, it can be seen that the cell with the largest cell current will still be able to control the state of the latch section 202. This differential action enhances the reliability of the operation of the subject data storage unit. Note also that the outputs of inverters 205 and 209 are coupled to respective inverters 228 and 230 SO that loading on the latch section outputs will be equal. The latch section will thus remain capacitively balanced so as to enhance the ability of the flash cells C and $\overline{C}$ to force the latch section to any desired state.

Verify As previously explained, the Verify cycle is used to determine the state of the latch section 202. This operation can be used to determine the state of the flash section 200 if it preceded by a Recall cycle. The Verify cycle utilizes the complementary data inputs A and $\overline{A}$ and compares them with the state of the latch section 202. Comparator section 201 functions essentially as an exclusive NOR circuit and provides a logic low output $\overline{V}_{ER}$ in the event there is a match between the latch section 202 and the data input A and $\overline{A}$.

By way of example, assume that a Verify cycle is to take place so that the verify signal $F_V$ is made active. This will cause transistor 218 of the comparator section 201 to be conductive. Further assume that data input A is a logic "1" (high) so that $\overline{A}$ is a logic "0" (low). Still further assume that inverter 205 output of the latch section 202 is a logic "0" so that the inverter 209 output will be a logic "1". Since input A is high and since the output of inverter 205 is low, transistor 220 of the comparator 201 section will be conductive and transistor 224 will be off. Similarly, since input $\overline{A}$ is low and the output of inverter 209 is high, transistor 222 will be off and transistor 226 will be on. There is a pull-up device (not depicted) connected between the output of the comparator section 201 and voltage $V_{CC}$. As a result of transistors 224 and 222 being off, there will be no conductive path between the source of transistor 218 and the circuit common. Accordingly, the output $\overline{V}_{ER}$ will remain in a high state ("1") indicating a valid compare.

If the outputs of inverters 205 and 209 were logic "1" and "0", respectively, and the data inputs A and $\overline{A}$ remain the same, transistors 220 and 224 will both be conductive. Thus, when transistor 218 is turned on by signal $F_V$, the output $V_{ER}$ will be pulled down to a logic "0" indicating a no compare condition.

In the event the data inputs A and $\overline{A}$ are a logic "0" and "1", respectively, and the outputs of inverters 205 and 209 are a logic "1" and "0", respectively, transistors 220 and 226 will be off. Thus, signal $V_{ER}$ will be a logic "1" thereby indicating a valid compare. Continuing, if inputs A and $\overline{A}$ were a logic "0" and "1", respectively and inverters 205 and 209 were a logic "0" and "1", respectively, transistors 222 and 226 will be conductive so that signal $\overline{V}_{ER}$ will be at a logic "0", thereby indicating a no compare.

Figure 8:
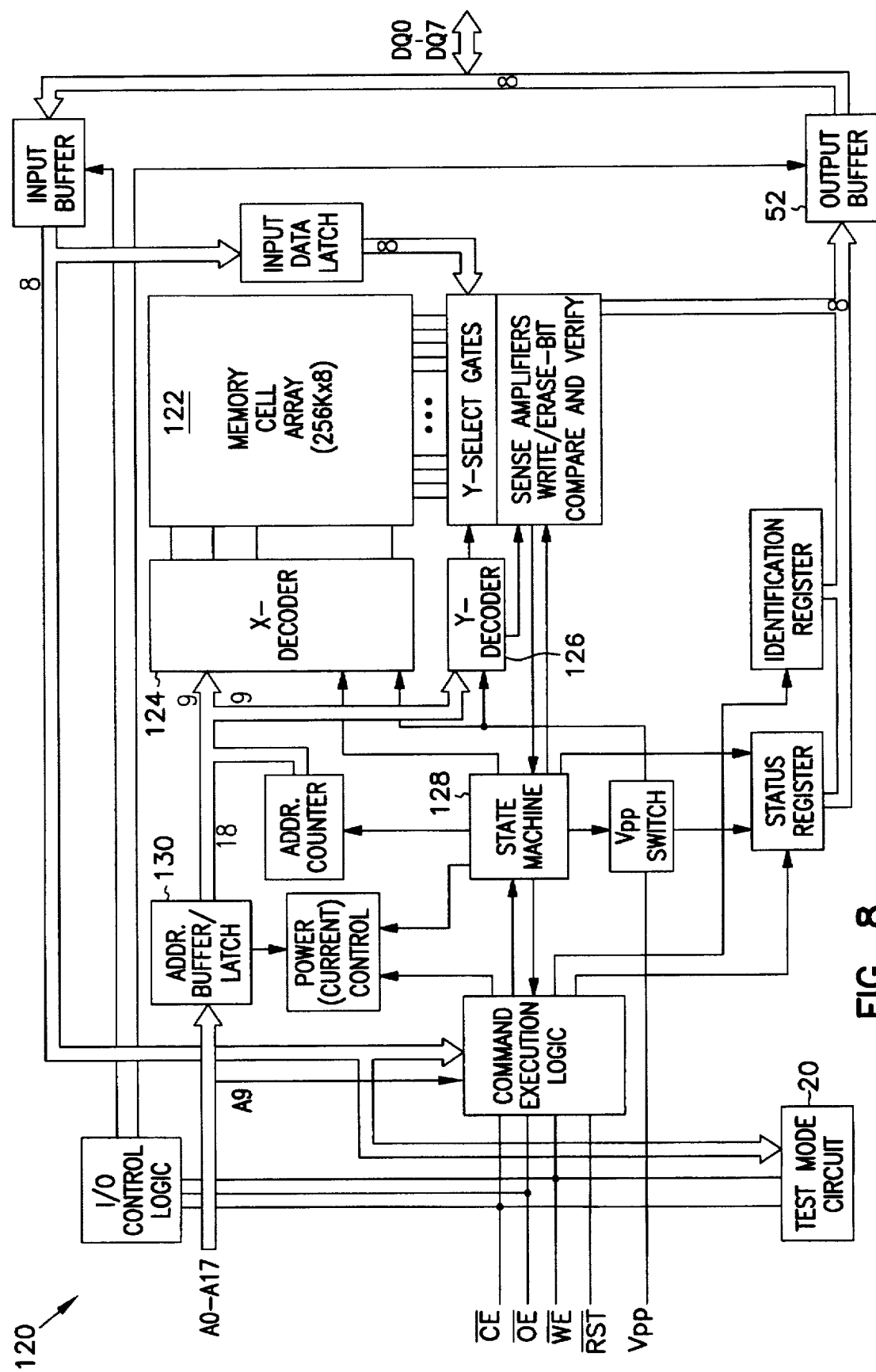
FIG. 8 is a block diagram illustrating a memory system having the test mode circuit of FIG. 1 incorporated therein.

FIG. 8 shows a memory system 120 having the test mode circuit 20 incorporated therein. The core of the memory system 120 is an Array 122 of memory cells, in this case flash memory cells, arranged in rows and columns with there being a total of 256K of eight bit words (one byte) in the Array 122. The address inputs A0–A17 are first received by an address buffer/latch 130. The individual cells (not depicted) are addressed by eighteen bits or address A0–A17, with nine bits being used by an X Decoder 124 to select the row of the Array 122 in which the target cell is located and the remaining nine bits being used by a Y decoder 126 to select the appropriate column of the Array 122.

The memory system 120 is of the type which contains an internal State Machine 128 to control the detailed operations of the memory system 120 such as the various individual steps necessary for carrying out programming, reading and erasing operations. The State Machine 128 thus functions to reduce the overhead required of the processor (not depicted) typically used in association with the memory system 120. Since programming and erasing operations for flash memories are relatively slow, these devices are considered to be "read mostly" memories where read access times determine the overall memory performance.

In an alternate embodiment, the storage unit 70 could be implemented as a fuse link or an anti-fuse link which are initially either open or shorted and which may be modified by laser or other means to disable the low voltage test modes prior to leaving the factory. When the parts come out of fabrication the fuse is set to enable the low voltage test modes. After testing, a laser is used to modify the fuse to disable the low voltage test modes before the part is shipped to a user.

It should be understood that various alternatives to the embodiments of the invention described herein may be employed in practicing the invention. It is intended that the following claims define the scope of the invention and that structures and methods within the scope of these claims and their equivalents be covered thereby.

What is claimed is:

1. A test mode circuit for use in a data system having an input, comprising:

a test mode code latch for receiving a test mode code;

a switch which when turned on couples the test mode code latch to the input so that the test mode code can be transferred from the input to the test mode code latch;

a test mode command decoder coupled to the test mode code latch for decoding the test mode code to initiate a test mode of operation in the data system;

a data storage unit coupled to the test mode command decoder for storing a data bit which corresponds to a low voltage first test mode enable signal, wherein the data bit may be modified during the test mode of operation;

a low voltage test mode circuit coupled to the data storage unit which, after first being enabled by the low voltage first test mode enable signal, can be controlled to turn the switch on and off; and an enable signal generation circuit which couples the low voltage test mode circuit to the switch for turning the switch on and off.

2. A test mode circuit in accordance with claim 1, wherein:

the enable signal generation circuit generates a second test mode enable signal indicating to the data system that a test mode code may be transferred into the test mode code latch; and the low voltage test mode circuit generates first and second outputs which are coupled to the enable signal generation circuit, wherein the enable signal generation circuit is configured to turn on the switch and activate the second test mode enable signal in response to active signals on both the first and second outputs of the low voltage test mode circuit.

3. A test mode circuit in accordance with claim 1, wherein:

the enable signal generation circuit generates a test mode execute enable signal indicating to the data system that the test mode of operation may be executed; and the low voltage test mode circuit generates first and second outputs which are coupled to the enable signal generation circuit, wherein the enable signal generation circuit is configured to turn the switch off and to activate the test mode execute enable signal in response to an active signal on the first output of the low voltage test mode circuit and an inactive signal on the second output of the low voltage test mode circuit.

4. A test mode circuit in accordance with claim 1, wherein the low voltage test mode circuit comprises:

a first latch which generates a first output which is coupled to the enable signal generation circuit, the first latch being set in response to a first test signal which is generated by the data system; and a second latch which generates a second output which is coupled to the enable signal generation circuit, the second latch being set in response to a second test signal which is generated by the data system.

5. A test mode circuit in accordance with claim 4, wherein the low voltage test mode circuit includes circuitry which resets the first latch one clock pulse after the second latch has been set.

6. A test mode circuit in accordance with claim 1, wherein the data storage unit is a non-volatile data storage unit which includes a flash memory cell for storing the data bit.

7. A test mode circuit in accordance with claim 6, wherein the data storage unit further includes a volatile data latch coupled to the flash memory cell.

8. A test mode circuit in accordance with claim 7, wherein the data bit in the data storage unit is modified by transferring new data to the volatile data latch and then transferring the new data from the volatile data latch to the flash memory cell.

9. A test mode circuit in accordance with claim 1, further comprising:

a first voltage detector coupled to the enable signal generation circuit for detecting a test activation voltage; and a second voltage detector coupled to the enable signal generation circuit for detecting the test activation voltage;

wherein, the switch is turned on in response to both the first and second voltage detectors detecting the test activation voltage.

10. A memory system, comprising:

a data buffer;

a normal mode command decoder coupled to decode normal mode codes received from the data buffer and for generating normal mode command signals in response thereto;

a test mode command decoder for decoding test mode codes and for generating test mode command signals in response thereto to initiate a test mode of operation in the memory system;

a switch which when turned on completes a path between the data buffer and the test mode command decoder so that test mode codes can be transferred from the data buffer to the test mode command decoder;

a low voltage test mode circuit coupled to the normal mode command decoder which, after first being enabled during the test mode of operation, can be controlled by the normal mode command signals to turn the switch on and off; and an enable signal generation circuit which couples the low voltage test mode circuit to the switch for turning the switch on and off.

11. A test mode circuit in accordance with claim 10, wherein:

the low voltage test mode circuit generates first and second outputs which are coupled to the enable signal generation circuit, wherein the enable signal generation circuit is configured to turn on the switch in response to active signals on both the first and second outputs of the low voltage test mode circuit.

12. A test mode circuit in accordance with claim 11, wherein the normal mode command signals generated by the normal mode command decoder includes first and second test signals, and wherein the low voltage test mode circuit comprises:

a first latch which generates the first output, the first latch being set in response to the first test signal; and a second latch which generates the second output, the second latch being set in response to the second test signal.

13. A test mode circuit in accordance with claim 12, wherein the low voltage test mode circuit includes circuitry which resets the first latch one clock pulse after the second latch has been set.

14. A test mode circuit in accordance with claim 10, further comprising:
a data storage unit coupled to the low voltage test mode circuit for storing a data bit which corresponds to a low voltage test mode enable signal, wherein the data bit may be modified during the test mode of operation and the low voltage test mode enable signal enables the low voltage test mode circuit.

15. A test mode circuit in accordance with claim 14, wherein the data storage unit is a non-volatile data storage unit which includes a flash memory cell for storing the data bit.

16. A test mode circuit in accordance with claim 15, wherein the data storage unit further includes a volatile data latch coupled to the flash memory cell.

17. A test mode circuit in accordance with claim 16, wherein the data bit in the data storage unit is modified by transferring new data to the volatile data latch and then transferring the new data from the volatile data latch to the flash memory cell.

18. A test mode circuit in accordance with claim 10, further comprising:
a first voltage detector coupled to the enable signal generation circuit for detecting a test activation voltage; and
a second voltage detector coupled to the enable signal generation circuit for detecting the test activation voltage;
wherein, the switch is turned on in response to both the first and second voltage detectors detecting the test activation voltage.

19. A data system operable in a normal mode of operation and a test mode of operation, comprising:
a test mode circuit configured to receive test mode codes and to initiate the test mode of operation in the data system in response to a test mode activation condition;
a data storage unit coupled to the test mode circuit and configured to store a data bit which corresponds to a first test mode enable signal and configured to permit modification of the data bit during the test mode of operation and not during the normal mode of operation; and
a low voltage test mode circuit coupled to the data storage unit and configured to provide the test mode activation condition to the test mode circuit in response to a software command after first being enabled by the first test mode enable signal.

20. A data system in accordance with claim 19, wherein the data storage unit comprises a nonvolatile data storage unit.

21. A data system in accordance with claim 19, wherein the data storage unit is rewritable.

22. A data system in accordance with claim 19, wherein the data storage unit comprises a nonvolatile data storage unit which includes a flash memory cell for storing the data bit.

23. A data system in accordance with claim 19, wherein the low voltage test mode circuit generates and provides to the test mode circuit a first output and a second output as the test mode activation condition.

24. A data system in accordance with claim 23, wherein the low voltage test mode circuit comprises:
a first latch configured to generate the first output and to be set in response to a first test signal generated by the data system in response to the software command; and
a second latch configured to generate the second output and to be set in response to a second test signal which is generated by the data system in response to the software command.

25. A method of placing a data system in a test mode of operation, comprising:
storing a data bit which corresponds to a first test mode enable signal in a data storage unit configured to permit modification of the data bit during the test mode of operation and not during a normal mode of operation;
providing the first test mode enable signal to a low voltage test mode circuit configured to generate a test mode activation condition in response to a software command after first being enabled by the first test mode enable signal; and
providing the test mode activation condition to a test mode circuit configured to receive test mode codes and to initiate the test mode of operation in the data system in response to the test mode activation condition.

26. A method in accordance with claim 25, wherein the step of storing a data bit which corresponds to a first test mode enable signal in a data storage unit comprises the step of:
storing the data bit in a non-volatile data storage unit.

27. A method in accordance with claim 25, wherein the step of storing a data bit which corresponds to a first test mode enable signal in a data storage unit comprises the step of:
storing the data bit in a data storage unit that is rewritable.

28. A method in accordance with claim 25, wherein the step of providing the test mode activation condition to a test mode circuit comprises the step of:
providing a first output and a second output to the test mode activation circuit.

29. A method in accordance with claim 28, wherein the step of providing a first output and a second output to the test mode activation circuit comprises the steps of:
setting a first latch configured to generate the first output in response to a first test signal generated by the data system in response to the software command; and
setting a second latch configured to generate the second output in response to a second test signal which is generated by the data system in response to the software command.

30. A method of placing a data system in a test mode of operation, comprising:
storing a data bit which corresponds to a first test mode enable signal in a data storage unit configured to permit modification of the data bit during the test mode of operation;
providing the first test mode enable signal to a low voltage test mode circuit to enable it;
providing a software command to the low voltage test mode circuit;
generating a test mode activation condition in response to the software command being provided to the low voltage test mode circuit;
turning on a switch to couple a test mode code latch to an input of the data system in response to the test mode activation condition;
transferring a test mode code from the input to the test mode code latch; and
decoding the test mode code to initiate the test mode of operation in the data system.

31. A method in accordance with claim 30, wherein the step of storing a data bit which corresponds to a first test mode enable signal in a data storage unit comprises the step of:

storing the data bit in a non-volatile data storage unit.

32. A method in accordance with claim 30, wherein the step of storing a data bit which corresponds to a first test mode enable signal in a data storage unit comprises the step of:

storing the data bit in a data storage unit that is rewritable.

33. A method in accordance with claim 30, wherein the step of generating a test mode activation condition comprises the step of:

generating a first output and a second output.

34. A method in accordance with claim 33, wherein the step of generating a first output and a second output comprises the steps of:

setting a first latch configured to generate the first output in response to a first test signal generated by the data system in response to the software command; and setting a second latch configured to generate the second output in response to a second test signal which is generated by the data system in response to the software command.

* * * * *